(12) United States Patent
Kim

(10) Patent No.: US 7,262,448 B2
(45) Date of Patent: Aug. 28, 2007

(54) CMOS IMAGE SENSOR

(75) Inventor: Young Rok Kim, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 162 days.

(21) Appl. No.: 11/020,526

(22) Filed: Dec. 27, 2004

(65) Prior Publication Data
US 2005/0280108 A1 Dec. 22, 2005

(30) Foreign Application Priority Data
Jun. 22, 2004 (KR) .................. 10-2004-0046537

(51) Int. Cl.
H01L 31/062 (2006.01)
H01L 31/113 (2006.01)
(52) U.S. Cl. .................. 257/294; 257/431; 257/432; 257/433; 257/434
(58) Field of Classification Search ................. 257/233, 257/234, 291–294, 431–434, 436
See application file for complete search history.

(56) References Cited

U.S. PATENT DOCUMENTS 6,617,189 B1 * 9/2003 Chen et al. .................. 438/48
7,019,373 B2 * 3/2006 Hashimoto .................. 257/432

FOREIGN PATENT DOCUMENTS

KR   10-2002-0042098   6/2002

OTHER PUBLICATIONS

Office Action issued by the Korean Intellectual Property Office on Jul. 27, 2006, in counterpart Korean Patent Application No. 10-2004-0046537.

* cited by examiner

Primary Examiner—Thien F Tran
(74) Attorney, Agent, or Firm—Finnegan, Henderson, Farabow, Garrett & Dunner, L.L.P.

(57) ABSTRACT

A CMOS image sensor is disclosed, to improve light-condensing efficiency by forming a minute lens array having a large curvature (long focal distance) for the increase in height of upper structures above a photodiode, which includes a lower layer formed of the photodiode, metal circuits, and insulating interlayers for insulating the metal circuits from one another; a color filter array of R, G and B formed on the lower layer; an overcoat layer formed on the color filter array; a micro-lens formed on the overcoat layer; and the minute lens array having minute lenses formed between the lower layer and the color filter array, each minute lens having a larger curvature than that of the micro-lens.

2 Claims, 3 Drawing Sheets

CMOS IMAGE SENSOR

CROSS-REFERENCE TO RELATED APPLICATIONS

This application claims the benefit of Korean Application No. P2004-46537 filed on Jun. 22, 2004, which is hereby incorporated by reference as if fully set forth herein.

BACKGROUND OF THE INVENTION

1. Field of the Invention

The present invention relates to an image sensor, and more particularly, to a CMOS image sensor suitable for improving light-condensing efficiency.

2. Discussion of the Related Art

In general, an image sensor is a semiconductor device for converting an optical image to electric signals, which is largely classified into a charge coupled device (herein after, referred to as CCD) and a CMOS image sensor.

In case of the CCD, respective MOS (metal-oxide-silicon) capacitors are adjacent to one another, wherein electric charge carriers are stored in and are transferred to the capacitors. Meanwhile, the CMOS image sensor uses a CMOS technology of using a control circuit and a signal processing circuit as peripheral circuits. That is, in case of the CMOS image sensor, MOS transistors are provided in correspondence with pixels, and outputs are detected in sequence, thereby applying a switching method.

The CCD has the disadvantageous characteristics of the high power consumption and the complicated fabrication process generated by a large number of masks. In the CCD, it is impossible to provide the signal processing circuit within a CCD chip, whereby it cannot be provided as one chip. In order to overcome these problems, the CMOS image sensor using a sub-micron CMOS technology has been researched and developed.

The various pixels may be used for the CMOS image sensor. Among them, a 3-T structure pixel and a 4-T structure pixel are most generally used for the CMOS image sensor. In more detail, the 3-T structure pixel is comprised of three transistors and one photodiode, and the 4-T structure pixel is comprised of four transistors and one photodiode.

FIG. 1 shows a circuit view of a unit pixel in a general 4-T CMOS image sensor.

As shown in FIG. 1, the unit pixel of the 4-T CMOS image sensor is provided with a photodiode PD for sensing light, and four NMOS transistors (Tx, Rx, Dx, Sx).

Among the four NMOS transistors, the transfer transistor Tx transfers optical charges generated in the photodiode PD to a floating sensing node, and the reset transistor Rx discharges the optical charges stored in the floating sensing node to detect signals. Also, the drive transistor Dx functions as a source follower, and the select transistor Sx is provided for switching and addressing.

In addition, 'DC gate' is a load transistor for maintaining a constant current by applying a constant voltage for a gate potential of the transistor, '$V_{DD}$' is a driving voltage, '$V_{SS}$' is a ground voltage, and 'output' is an output voltage of the unit pixel.

Hereinafter, a related art CMOS image sensor will be described with reference to the accompanying drawings.

FIG. 2 shows a schematic view of a CMOS image sensor according to the related art. In the related art CMOS image sensor, as shown in FIG. 2, a semiconductor substrate 11 is defined as a field area and an active area by STI films 12 formed by a trench isolation technology. Also, a photodiode PD is formed in the semiconductor substrate 11 of the active area between the STI films 12, wherein the photodiode PD receives the incident light and stores the electric charges. Then, metal circuits M1, M2, and M3 are provided to form the unit pixel, and insulating interlayers 13, 14, 15, and 16 are provided to insulate the metal circuits M1, M2, and M3 from one another.

As described above, the unit pixel of the CMOS image sensor is provided with the photodiode PD and the plurality of transistors for the signal processing. In this state, the metal circuits M1, M2, and M3 are provided to form the unit pixel, wherein the metal circuits M1, M2, and M3 are positioned not to prevent the incident light.

In addition, a protective layer 17 is formed on the insulating interlayer 16, so as to protect the photodiode PD and the metal circuits M1, M2, and M3 from external moistures and scratches. Then, a planarization layer 18 is formed on the protective layer 17, to solve the problem of step coverage, and to improve adhesion.

On the planarization layer 18, a color filter layer 19 is formed, wherein the color filter layer 19 is formed of dyeable photoresist of red, green, and blue above the photodiodes PD. After that, an overcoat layer 20 is formed on the color filter layer 19, wherein the overcoat layer 20 is provided to overcome the problem of step coverage, to obtain uniformity of micro-lens, and to control a focal distance. Then, the dome-shaped micro-lens 21 is provided on the overcoat layer 20, so as to condense the light to the color filter array.

However, the related art CMOS image sensor has the following disadvantages.

With the recent trend toward high-resolution and high-quality image sensors, there is requirement for decreasing the size of device. As a result, it is necessary to decrease a design rule, whereby the size of unit pixel in the CMOS image sensor decreases gradually.

Accordingly, as compared with the size of photodiode PD, upper structures, for example, the insulating interlayers and metal lines provided above the photodiode PD, increase, so that the distance from the micro-lens 21 to the photodiode PD increases. In this state, it is difficult to fabricate the micro-lens for controlling the focus of the photodiode PD.

Also, as compared with the focal distance of the micro-lens, the photodiode PD is distant from the micro-lens. In this state, the light refracted by the micro-lens may not be received to the photodiode PD.

SUMMARY OF THE INVENTION

Accordingly, the present invention is directed to a CMOS image sensor that substantially obviates one or more problems due to limitations and disadvantages of the related art.

An object of the present invention is to provide a CMOS image sensor, to improve light-condensing efficiency.

Another object of the present invention is to provide a CMOS image sensor, to obtain high integration by preventing the drop of light-condensing efficiency with the decrease in size of the CMOS image sensor.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a CMOS image sensor includes a lower layer formed of a photodiode, metal circuits, and insulating interlayers for insulating the metal circuits from one another; a color filter array of R, G and B formed on the lower layer; an overcoat layer formed on the color filter array; a micro-lens formed on the overcoat layer; and a minute lens array having minute lenses formed between the lower layer and the color filter array, each minute lens having a larger curvature than that of the micro-lens.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a CMOS image sensor according to the present invention will be described with reference to the accompanying drawings.

Figure 1:
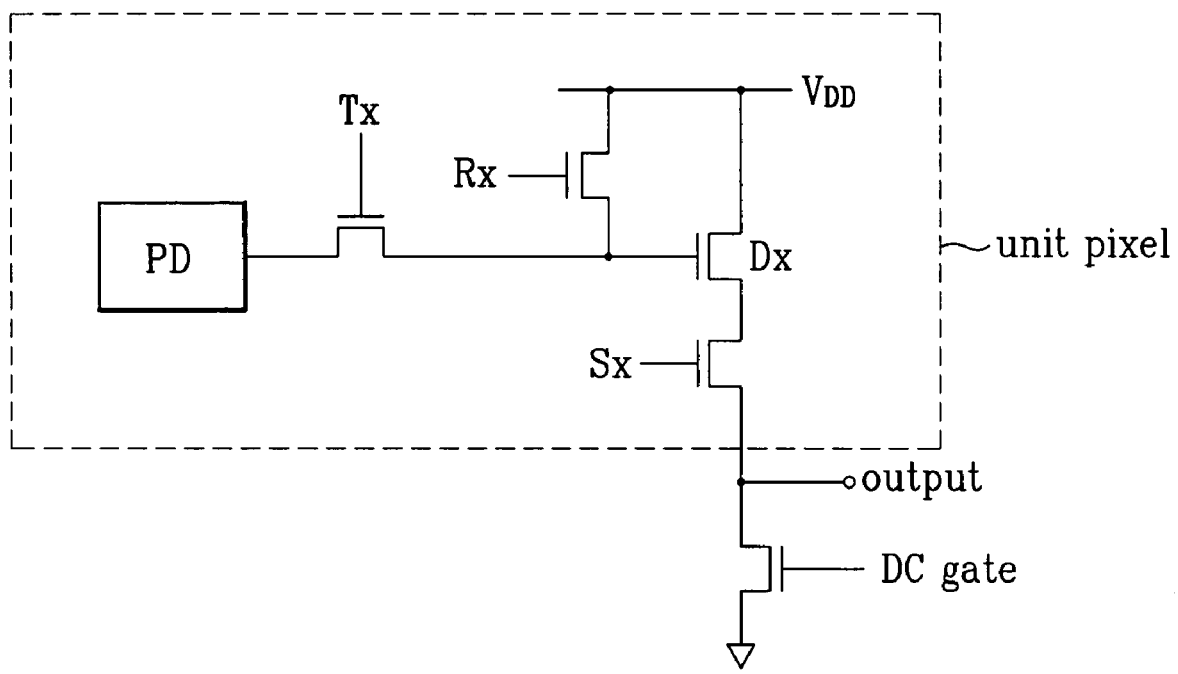
FIG. 1 shows a circuit view of a unit pixel in a general 4-T CMOS image sensor.
Figure 2:
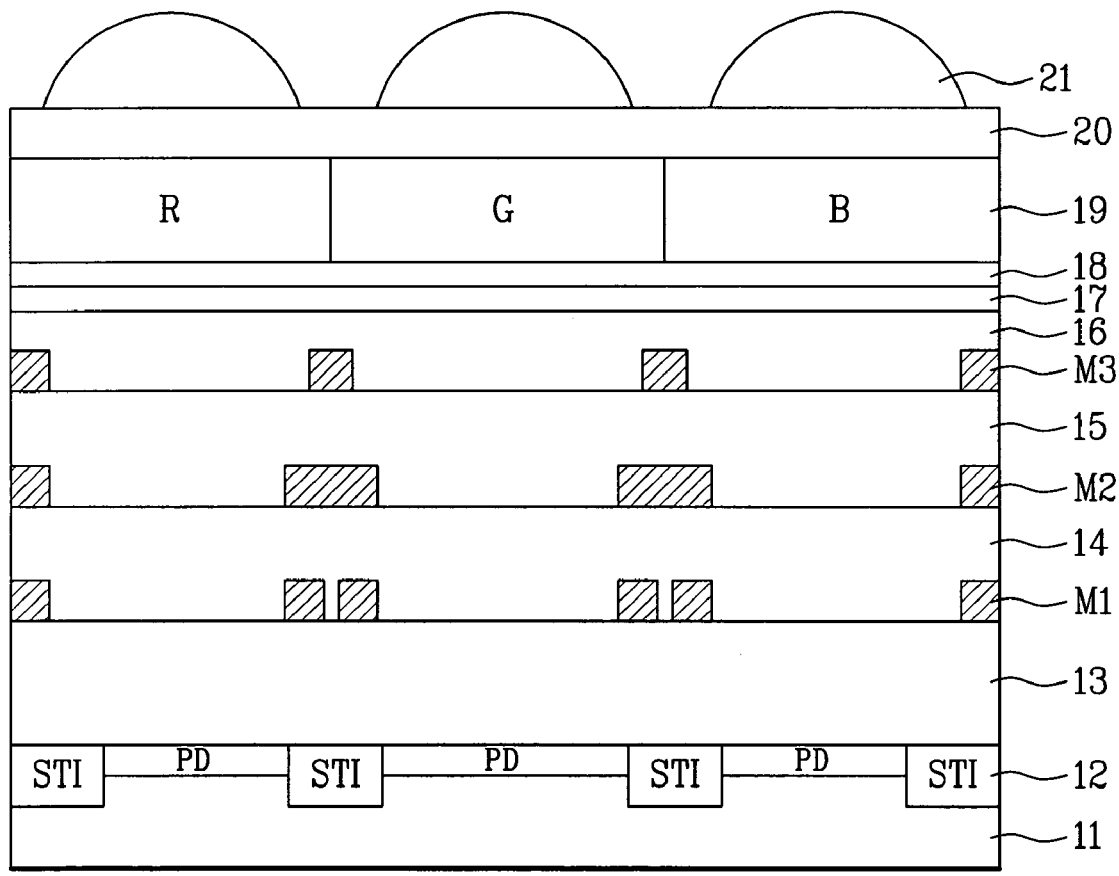
FIG. 2 shows a schematic view of a CMOS image sensor according to the related art.
Figure 3:
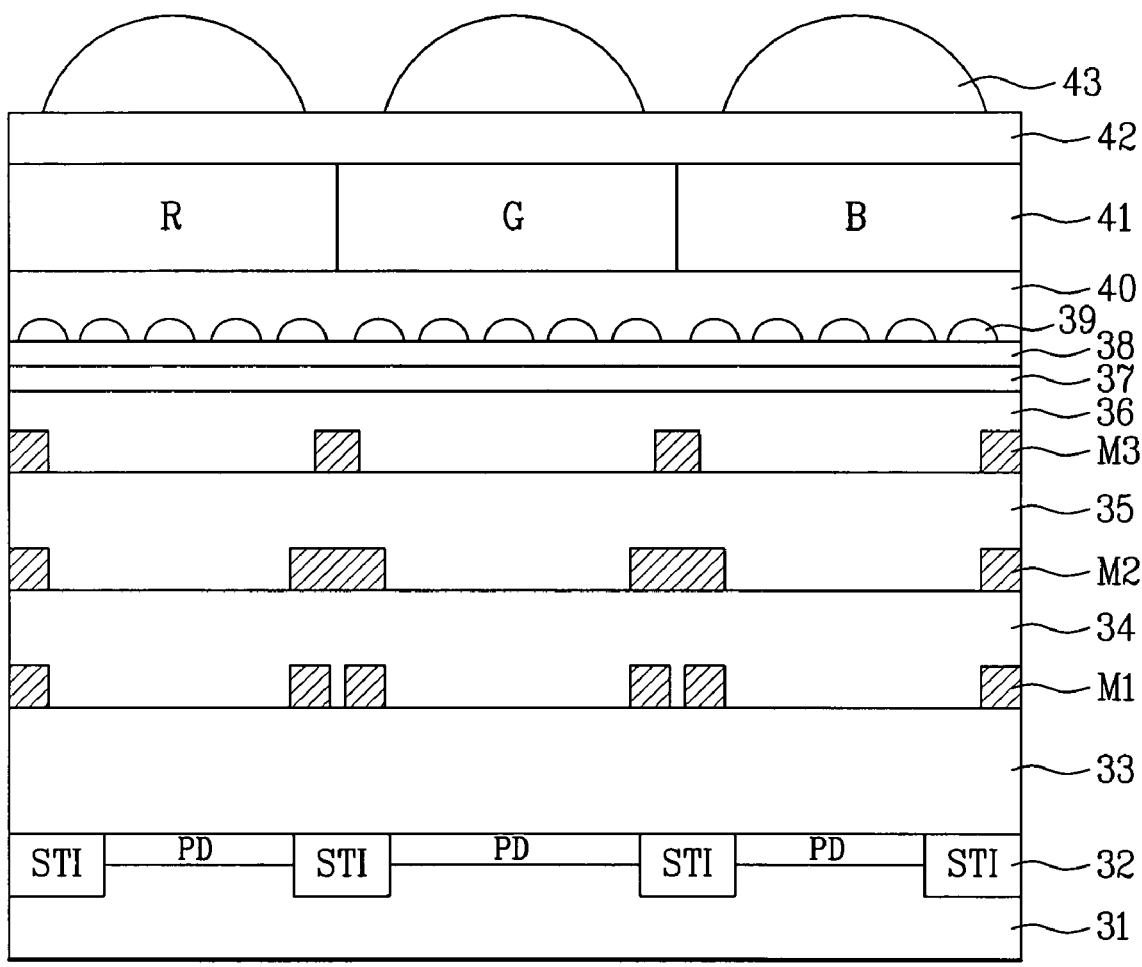
FIG. 3 shows a schematic view of a CMOS image sensor according to the present invention.

FIG. 3 shows a schematic view of a CMOS image sensor according to the present invention. In FIG. 3, a minute lens array 39 is provided below a color filter array 41, wherein the minute lens array 39 is comprised of minute lenses, each minute lens having a larger curvature (longer focal distance) than that of a micro-lens 42.

The minute lens array 39 has the same function as a fly eye lens used for exposure equipment, whereby the minute lens array 39 diffuses the light, emitted from a light source, to a uniform surface light source, and condenses the light source at a constant degree.

Meanwhile, the minute lenses of the minute lens array 39 have the longer focal distance than that of the micro-lens 43, so that the light is smoothly transmitted to a photodiode PD.

The CMOS image sensor of the minute lens array 39 according to the present invention includes an STI film 32 formed in a semiconductor substrate 31 to define a field area and an active area, the photodiode PD formed in the active area of the semiconductor substrate 31 between the STI films 32, metal circuits M1, M2 and M3 for forming a unit pixel, and insulating interlayers 33, 34, 35 and 36 for insulating the metal circuits M1, M2 and M3 to one another as lower layers.

On the lower layers, a protective layer 37 is provided to protect the photodiode PD and the metal circuits M1, M2 and M3 from external moistures and scratches. Then, a first planarization layer 38 is formed on the protective layer 37 to overcome the problem of step coverage and to improve adhesion.

After that, the minute lens array 39 of the minute lenses is provided on the first planarization layer 38, wherein the minute lens has the large curvature than that of the micro-lens 43. Then, the minute lens array 39 is covered with a second planarization layer 40.

On the second planarization layer 40, the color filter array 41 is formed of dyeable photoresist of red, green and blue. Then, an overcoat layer 42 is formed on the color filter array 41 so as to overcome the problem of step coverage, to obtain uniformity of the micro-lens, and to control the focal distance of the micro-lens. Thereafter, the micro-lens 43 having the smaller curvature than that in the minute lens of the minute lens array 39 is formed on the overcoat layer 42, whereby the micro-lens 43 condenses the light to the color filter array.

In the CMOS image sensor according to the present invention, when the light is incident, the light is firstly condensed by the micro-lens 43, and then the light passes through the color filter array 41. After that, the light passing through the color filter array 41 is secondly condensed by the minute lens array 39 having the long focal distance, whereby the light is smoothly transmitted to the photodiode PD.

The minute lens array 39 has the same function as the fly eye lens. That is, as the light passes through the minute lens array 39, the light is diffused to the surface light source, and is condensed constantly, so that the light is transmitted to the photodiode PD.

As explained above, the CMOS image sensor according to the present invention has the following advantages.

First, the light is smoothly transmitted to the photodiode PD by the minute lens array having the long focal distance, thereby improving the light-condensing efficiency.

Also, it is possible to decrease the size of pixel with the minute lens array having the long focal distance. Accordingly, even though the height of upper structures increases, the light is transmitted to the photodiode PD, thereby realizing the high-integration device.

Furthermore, the minute lens array has the same function as the fly eye lens, so that it is possible to improve uniformity of light transmitted to the photodiode PD.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:
1. A CMOS image sensor comprising:
   a lower layer formed of a photodiode, metal circuits, and insulating interlayers for insulating the metal circuits from one another;
   a color filter array of R, G, and B formed on the lower layer;
   an overcoat layer formed on the color filter array;
   a micro-lens formed on the overcoat layer;
   a minute lens array having a plurality of minute lenses, on the photodiode, formed between the lower layer and the color filter array, each minute lens having a larger curvature than that of the micro-lens a protective layer formed between the lower layer and the color filter array, so as to protect the photodiode and the metal circuits; and a first planarization layer formed on the protective layer, to have the minute lens array thereon.

2. The CMOS image sensor of claim 1, further comprising a second planarization layer to cover the minute lens array.

* * * * *